United States Patent
Han et al.

(10) Patent No.: US 10,991,884 B2
(45) Date of Patent: Apr. 27, 2021

(54) MASK PLATE, OLED DISPLAY SUBSTRATE, DISPLAY DEVICE AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Mingkun Han, Beijing (CN); Yan Hu, Beijing (CN); Hongguang Yuan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/335,514

(22) PCT Filed: Jun. 28, 2018

(86) PCT No.: PCT/CN2018/093290
§ 371 (c)(1),
(2) Date: Mar. 21, 2019

(87) PCT Pub. No.: WO2019/033856
PCT Pub. Date: Feb. 21, 2019

(65) Prior Publication Data
US 2020/0020861 A1    Jan. 16, 2020

(30) Foreign Application Priority Data
Aug. 17, 2017    (CN) .......................... 201710707156.7

(51) Int. Cl.
*H01L 51/00* (2006.01)
*C23C 14/04* (2006.01)
(Continued)

(52) U.S. Cl.
CPC ........ *H01L 51/0011* (2013.01); *C23C 14/042* (2013.01); *H01L 27/3246* (2013.01);
(Continued)

(58) Field of Classification Search
CPC .................................................. H01L 51/0011
See application file for complete search history.

(56) References Cited

U.S. PATENT DOCUMENTS 7,563,147 B2 * 7/2009 Sakai .................. H01L 51/5221
445/24
2004/0135498 A1    7/2004 Takanosu et al.
(Continued)

FOREIGN PATENT DOCUMENTS

CN    104867963 A    8/2015
CN    105428389 A    3/2016
(Continued)

OTHER PUBLICATIONS

International Search Report and Written Opinion for Application No. PCT/CN2018/093290, dated Sep. 18, 2018, 11 Pages.

*Primary Examiner* — Eugene Lee
(74) *Attorney, Agent, or Firm* — Brooks Kushman P.C.

(57) ABSTRACT

A mask plate, an OLED display substrate, a display device and a manufacturing method thereof are provided. The mask plate includes: a mask plate body and a first blocking wall arranged on the mask plate body, where the mask plate body is provided with a plurality of openings, the plurality of openings are arranged in a matrix; the first blocking wall is arranged to close to the plurality of openings, and at least
(Continued)

one part of the first blocking wall is arranged between two adjacent rows or adjacent columns of openings.

19 Claims, 6 Drawing Sheets

(51) Int. Cl.
    *H01L 27/32*     (2006.01)
    *H01L 51/56*     (2006.01)

(52) U.S. Cl.
    CPC ............ *H01L 51/001* (2013.01); *H01L 51/56* (2013.01); *H01L 2227/323* (2013.01)

(56) References Cited

U.S. PATENT DOCUMENTS

| | | | |
|---|---|---|---|
| 2016/0164046 A1* | 6/2016 | Uezawa | H01L 51/50 257/40 |
| 2016/0233457 A1* | 8/2016 | Choi | H01L 51/0013 |
| 2017/0025611 A1* | 1/2017 | Huang | H01L 51/0011 |
| 2017/0155075 A1 | 6/2017 | Bi et al. | |
| 2017/0213879 A1 | 7/2017 | Yang | |

FOREIGN PATENT DOCUMENTS

| | | |
|---|---|---|
| CN | 105633301 A | 6/2016 |
| CN | 106816554 A | 6/2017 |
| CN | 107385392 A | 11/2017 |

* cited by examiner

MASK PLATE, OLED DISPLAY SUBSTRATE, DISPLAY DEVICE AND MANUFACTURING METHOD THEREOF

CROSS-REFERENCE TO RELATED APPLICATIONS

This application is the U.S. national phase of PCT Application No. PCT/CN2018/093290 filed on Jun. 28, 2018, which claims priority to Chinese Patent Application No. 201710707156.7 filed on Aug. 17, 2017, which are incorporated herein by reference in their entireties.

TECHNICAL FIELD

The present disclosure relates to the field of display technology, and in particular to a mask plate, an OLED display substrate, a display device and a manufacturing method thereof.

BACKGROUND

An OLED (Organic Electroluminescent Light-Emitting Diode) display device, due to its unique advantages, such as fast response, all solid state, self-illumination, etc., has been paid attention by the market. The application of the OLED display device is also very diverse. Flexible displays, transparent displays and micro displays all use OLED display devices.

At present, the OLED display device generally uses an FMM (Fine Metal Mask) to evaporate organic light-emitting materials of R (red), B (blue), and G (green) sub-pixels in an opening region defined by a PDL (pixel defining layer) to form a light-emitting layer. During the evaporating process, an organic light-emitting material vapor flow is likely to flow to other PDL opening regions, resulting in poor color mixing and affecting the display effect of the OLED display device.

SUMMARY

A mask plate is provided in the present disclosure, including:

a mask plate body provided with a plurality of openings arranged in a matrix;

a first blocking wall on the mask plate body, in which the first blocking wall is close to the plurality of openings, and at least a portion of the first blocking wall is between two adjacent rows or adjacent columns of openings.

Optionally, the first blocking wall is annular and surrounds at least one opening on the mask plate body.

Optionally, the first blocking wall surrounds one opening on the mask plate body, and an orthographic projection of the opening onto the mask plate body coincides with an orthographic projection of a region surrounded by the first blocking wall onto the mask plate body.

Optionally, the first blocking wall surrounds a plurality of openings on the mask plate body, and orthographic projections of the openings onto the mask plate body is within an orthographic projection of a region surrounded by the first blocking wall onto the mask plate body.

Optionally, the first blocking wall is strip-like, and two first blocking walls are arranged between the two adjacent rows or two adjacent columns of the openings;

a length of the first blocking wall in a row direction is greater than or equal to a sum of lengths of the openings in the row direction in each row; or a length of the first blocking wall in a column direction is greater than or equal to a sum of lengths of the openings in the column direction in each column.

Optionally, the first blocking wall includes a plurality of first sub-blocking walls spaced apart from each other, two rows of the first sub-blocking wall are between two adjacent rows of the openings, and each of the first sub-blocking walls has a length in a row direction greater than or equal to a length of the opening corresponding to the first sub-blocking wall in the row direction; or two columns of the first sub-blocking wall are between two adjacent columns of the openings, and each of the first sub-blocking walls has a length in a column direction greater than or equal to a length of the opening corresponding to the first sub-blocking wall in the column direction.

Optionally, a material of the first blocking wall includes a photoresist.

A method for manufacturing a mask plate is further provided in the present disclosure, applied to manufacture the mask plate as described above, includes:

providing a mask plate body, provided with a plurality of openings arranged in a matrix;

forming a first blocking wall on the mask plate body, where the first blocking wall is close to the plurality of openings, and at least a portion of the first blocking wall is between two adjacent rows or adjacent columns of openings.

Optionally, the forming the first blocking wall on the mask plate body includes:

forming a photoresist layer on the mask plate body;

patterning the photoresist layer to form the first blocking wall.

A method for manufacturing an organic electroluminescent light-emitting diode OLED display substrate is further provided in the present disclosure, includes:

providing a substrate to be evaporated and the mask plate as described above;

adjusting a position of the mask plate to abut the first blocking wall against the substrate to be evaporated, where a position of the opening on the mask plate corresponds to a position of a first color sub-pixel on the substrate to be evaporated, and evaporating and forming a light-emitting layer of the first color sub-pixel;

adjusting the position of the mask plate to abut the first blocking wall against the substrate to be evaporated, in which the position of the opening on the mask plate corresponds to a position of a second color sub-pixel on the substrate to be evaporated, and evaporating and forming a light-emitting layer of the second color sub-pixel; and adjusting the position of the mask plate to abut the first blocking wall against the substrate to be evaporated, in which the position of the opening on the mask plate corresponds to a position of a third color sub-pixel on the substrate to be evaporated, and evaporating and forming a light-emitting layer of the third color sub-pixel; and in which a first color, a second color, and a third color are enabled mixed to be a white light.

An OLED display substrate is further provided in the present disclosure, is formed by the method as described above.

An OLED display substrate is further provided in the present disclosure, includes:

a base substrate;

a pixel defining layer on the base substrate, where the pixel defining layer defines a plurality of opening regions, the plurality of opening regions are arranged in a matrix;

a second blocking wall on the pixel defining layer, where the second blocking wall is close to the opening regions, and at least a portion of the second blocking wall is between adjacent rows or adjacent columns of the opening regions.

Optionally, the second blocking wall is annular and surrounds at least one opening region on the pixel defining layer.

Optionally, the second blocking wall surrounds one opening region on the pixel defining layer, an orthographic projection of the opening region onto the base substrate coincides with an orthographic projection of a region surrounded by the second blocking wall onto the base substrate.

Optionally, the second blocking wall surrounds a plurality of opening regions on the pixel defining layer, orthographic projections of the opening regions onto the base substrate are located within an orthographic projection of a region surrounded by the second blocking wall onto the base substrate.

Optionally, the second blocking wall is strip-like, and two second blocking walls are arranged between the two adjacent rows or two adjacent columns of the opening regions; where a length of the second blocking wall in a row direction is greater than or equal to a sum of lengths of the opening regions in the row direction in each row; or a length of the second blocking wall in a column direction is greater than or equal to a sum of lengths of the opening regions in the column direction in each column.

Optionally, the second blocking wall includes a plurality of second sub-blocking walls spaced apart from each other, where, two rows of the second sub-blocking wall are between two adjacent rows of the opening regions, and each of the second sub-blocking walls has a length in a row direction greater than or equal to a length of the opening region corresponding to the second sub-blocking wall in the row direction; or two columns of the second sub-blocking wall are between two adjacent columns of the opening regions, and each of the second sub-blocking walls has a length in a column direction greater than or equal to a length of the opening region corresponding to the second sub-blocking wall in the column direction.

An OLED display device is further provided in the present disclosure includes the OLED display substrate as described above.

A method for manufacturing an OLED display substrate is further provided in the present disclosure, applied to manufacture the OLED display substrate as described above, includes:

providing a base substrate;

forming a pixel defining layer on the base substrate, where the pixel defining layer defines a plurality of opening regions arranged in a matrix;

forming a second blocking wall on the pixel defining layer, where the second blocking wall is arranged close to the opening regions, and at least a portion of the second blocking wall is between adjacent rows or adjacent columns of the opening regions.

BRIEF DESCRIPTION OF THE DRAWINGS

In order to make the objects, technical solutions and advantages of the embodiments of the present disclosure more clear, the technical solutions of the embodiments of the present disclosure will be clearly and completely described below in conjunction with the drawings of the embodiments of the present disclosure. It is apparent that the described embodiments are a part of the embodiments of the present disclosure, and not all of them. Based on the described embodiments of the present disclosure, all other embodiments obtained by those skilled in the art fall within the scope of the disclosure.

DETAILED DESCRIPTION

In order to make the objects, technical solutions and advantages of the embodiments of the present disclosure more clear, the technical solutions of the embodiments of the present disclosure will be clearly and completely described below in conjunction with the drawings of the embodiments of the present disclosure. It is apparent that the described embodiments are a part of the embodiments of the present disclosure, and not all of them. Based on the described embodiments of the present disclosure, all other embodiments obtained by those skilled in the art fall within the scope of the disclosure.

A mask plate is provided in some embodiment of the present disclosure, including:

a mask plate body provided with a plurality of openings arranged in a matrix; and a first blocking wall, arranged on the mask plate body, in which the first blocking wall is arranged to close to the plurality of openings, and at least a portion of the first blocking wall is between two adjacent rows or adjacent columns of openings.

In some embodiments of the present disclosure, the first blocking wall is in a region surrounding the openings of the mask plate body. In the case that the light-emitting layer of the OLED display substrate is formed by the mask plate through an evaporation process, on one hand, the first blocking wall is able to abut against the place between the mask plate and the OLED display substrate to support the mask plate body; on the other hand, the first blocking wall is also able to block the vapor flow of an organic light-emitting material from flowing into other PDL opening regions of the OLED display substrate, thereby avoiding a poor color mixing and improving a display effect of the OLED display device; furthermore, the OLED display substrate does not need to be provided with a similar blocking wall, thereby saving a material applied to the OLED display substrate, reducing a thickness of a spacer layer between the light-emitting layers, and improving the flatness of the OLED display substrate. Thus, when a cathode is formed later, a cathode layer is prevented from being broken due to a too thick spacer layer. And in the case that the OLED display substrate is packaged by a thin film packaging layer, the risk of broking of a packaging film due to the too thick spacer layer may be avoided.

A structure of the mask plate in some embodiments of the present disclosure will be described below by examples.

Figure 1:
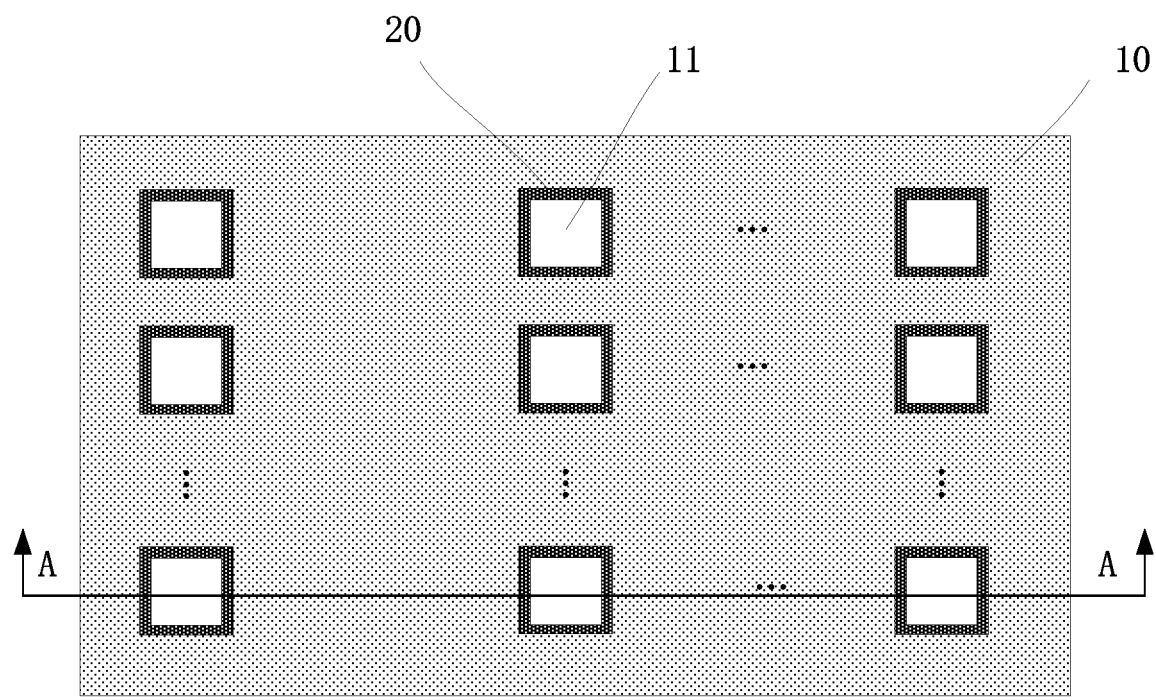
FIG. 1 is a top view of a mask plate in some embodiments of the present disclosure.
Figure 2:
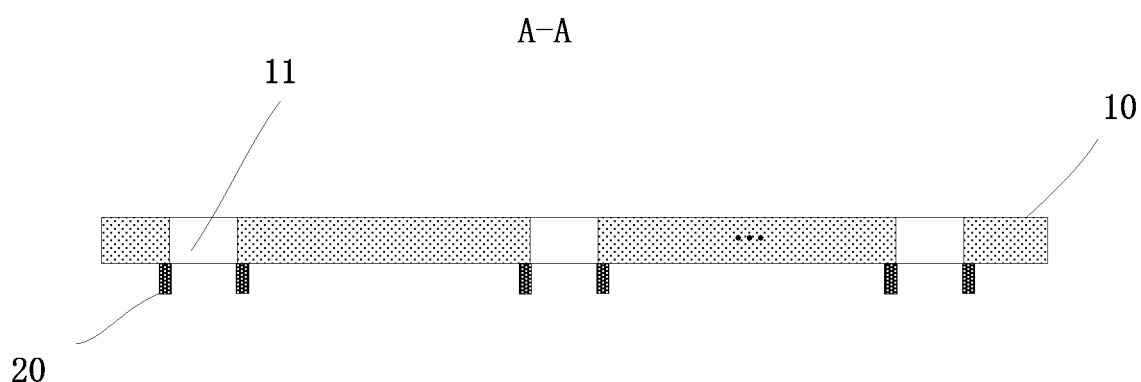
FIG. 2 is a cross-sectional view taken along line A-A of FIG. 1.

As shown in FIGS. 1-2, FIG. 1 is a top view of a mask plate in some embodiments of the present disclosure; FIG. 2 is a cross-sectional view taken along line A-A of FIG. 1. The mask plate in some embodiments of the present disclosure includes:

a mask plate body 10 provided with a plurality of openings 11 arranged in a matrix; and a first blocking wall 20 on the mask plate body 10, in which the first blocking wall 20 is annular, each annular first blocking wall 20 corresponds to and surrounds an opening 11 on the mask plate body 10.

In some embodiments of the present disclosure, in the case that the light-emitting layer of the OLED display substrate is formed by the mask plate through an evaporation process, a annular first blocking wall 20 is enabled to abut against a place between the mask plate body 10 and the OLED display substrate to support the mask plate body; and the annular first blocking wall 20, is also able to prevent the vapor flow of an organic light-emitting material from flowing into other PDL opening regions of the OLED display substrate in all directions, thereby avoiding poor color mixing and improving a display effect of the OLED display device.

In some embodiments of the present disclosure, an orthographic projection of the opening of the annular first blocking wall 20 onto the mask plate body 10 coincides with a corresponding opening 11 on the mask plate body 10. In other words, the edge of the opening of the annular first blocking wall 20 coincides with the edge of the corresponding opening 11 on the mask plate body 10, so that the vapor flow of the organic light-emitting material may be better limited within the corresponding opening 11.

Of course, in some embodiments of the present disclosure, the annular first blocking wall may not be arranged to abut against the corresponding opening on the mask plate body, but is arranged to keep a certain distance from the corresponding opening.

Figure 3:
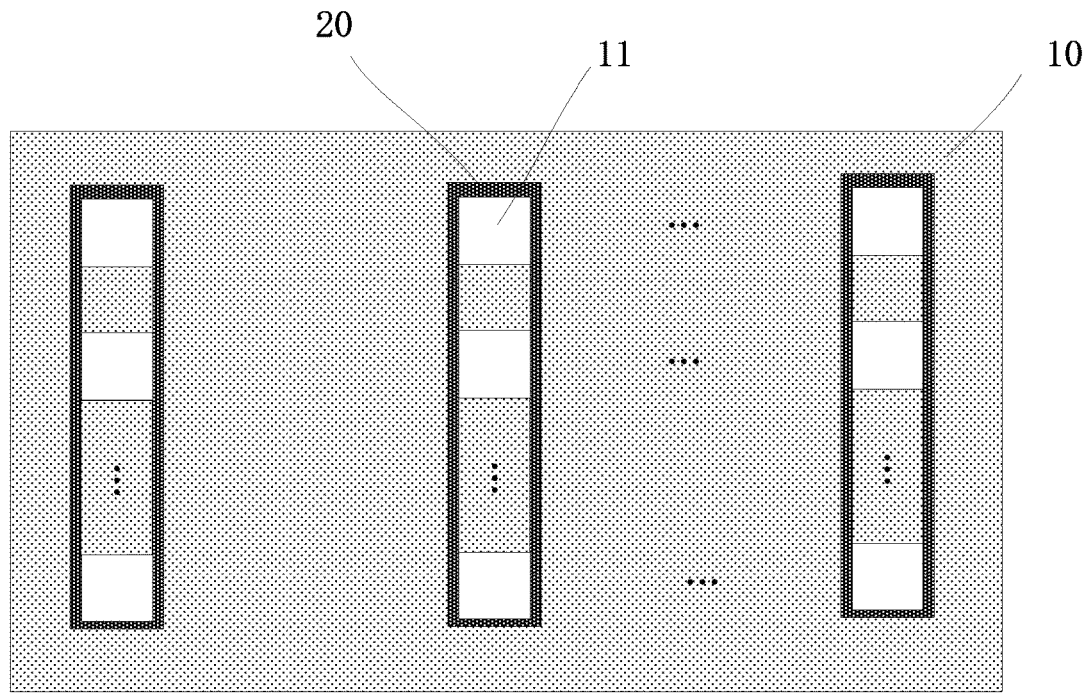
FIG. 3 is a top view of a mask plate in some embodiments of the present disclosure.

In some embodiments of the present disclosure, each annular first blocking wall 20 corresponds to an opening 11. Of course, in some embodiments of the present disclosure, each annular first blocking wall may also correspond to at least two openings in the mask plate body. In other words, each annular first blocking wall surrounds at least two openings in the mask plate body. For example, each annular first blocking wall corresponds to a row or a column of openings on the mask plate body. That is, each annular first blocking wall surrounds the row or the column of openings on the mask plate body. As shown in FIG. 3, in the embodiment shown in FIG. 3, each annular first blocking wall 20 corresponds to and surrounds a column of openings 11 in the mask plate body 10. As for the annular first blocking walls arranged to a row or a column of openings, that depends on the arrangement of the light-emitting layer on the OLED display substrate. If the colors of the different columns of the light-emitting layers on the OLED display substrate are different, the annular first blocking wall 20 corresponds to a column of openings; if the colors of the different rows of the light-emitting layers on the OLED display substrate are different, the annular first blocking wall 20 corresponds to a row of openings. In some embodiments of the present disclosure, since it is not necessary to make a corresponding annular first blocking wall for each opening, the difficulty of manufacturing the annular first blocking wall 20 may be reduced.

Figure 4:
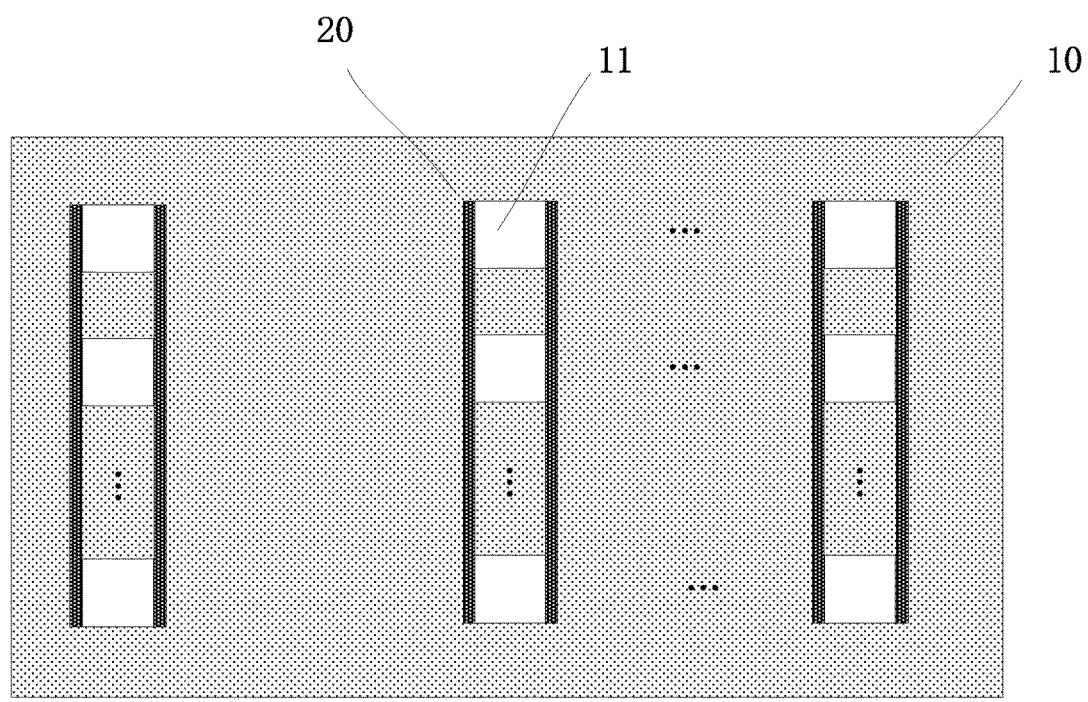
FIG. 4 is a top view of a mask plate in some embodiments of the present disclosure.

As shown in FIG. 4, FIG. 4 is a top view of a mask plate in some embodiments of the present disclosure; the mask plate according to some embodiments in the present disclosure includes:

a mask plate body 10 provided with a plurality of openings 11 arranged in a matrix; and a first blocking wall 20 on the mask plate body 10, in which the first blocking wall 20 is strip-like and is between the adjacent two rows of the openings 11, and two first blocking walls 20 are between the adjacent two columns of the openings 11, and each of the first blocking walls 20 is close to the opening 11 adjacent thereto.

In some embodiments of the present disclosure, in the case that the light-emitting layer of the OLED display substrate formed by evaporation is applied, a strip-like first blocking wall 20 is able to abut against the place between the mask plate body 10 and the OLED display substrate to support the mask plate body; and the strip-like first blocking wall 20, is also able to block the vapor flow of an organic light-emitting material from flowing into other PDL opening regions of the OLED display substrate, thereby avoiding poor color mixing and improving a display effect of the OLED display device.

In some embodiments of the present disclosure, a length of the strip-like first blocking wall is greater than or equal to a sum length of a column of corresponding openings, so that one side of the column of openings may be completely blocked. In the case that the light-emitting layer of the OLED display substrate is evaporated, the organic light-emitting material is prevented from diffusing toward one side of the openings.

In the case that colors of the different columns of the light-emitting layers on the OLED display substrate are different, the strip-like first blocking wall 20 corresponds to a column of openings and is between two adjacent columns of the openings 11. Of course, in some other embodiments of the present disclosure, in the case that the colors of the light-emitting layers of the OLED display substrate are different, the strip-like first blocking wall corresponds to a row of openings, and is between two adjacent rows of the openings. Two first blocking walls are between the two adjacent rows of the openings, and each of the first blocking walls is close to the opening adjacent thereto.

In some embodiments of the present disclosure, an edge of the strip-like first blocking wall closed to the corresponding opening coincides with an edge of the corresponding opening, so as to better limit the vapor flow of organic light-emitting material within the corresponding opening.

Of course, in some embodiments of the present disclosure, the strip-like first blocking wall may not be arranged to abut against the corresponding opening on the mask plate body, but is arranged to keep a certain distance from the corresponding opening.

Figure 5:
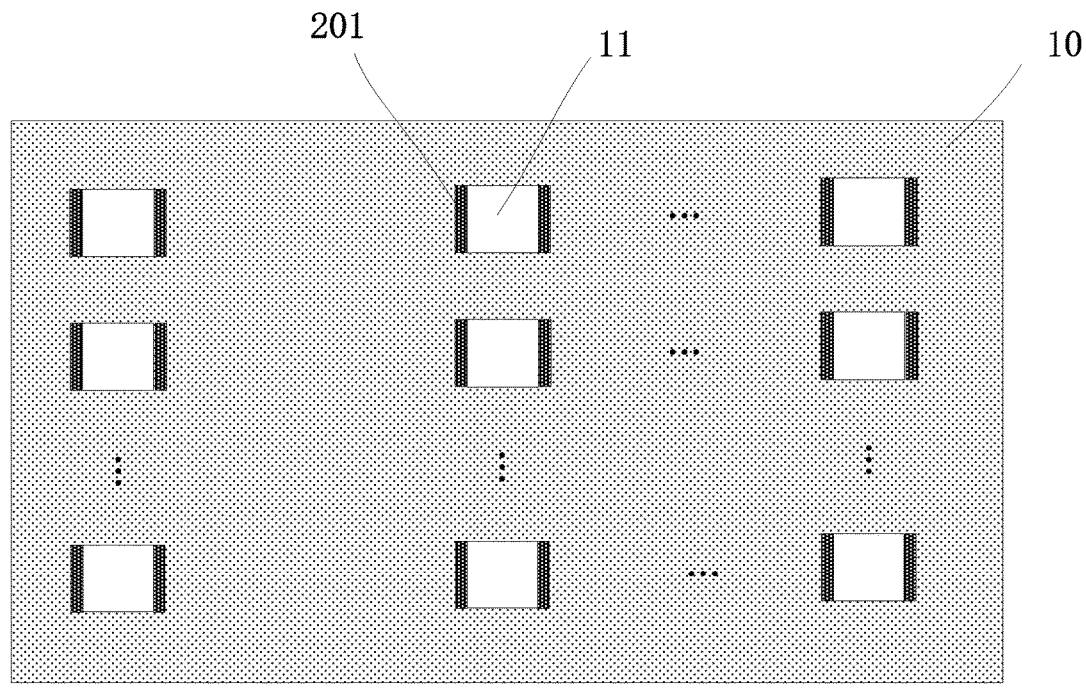
FIG. 5 is a top view of a mask plate in some embodiments of the present disclosure.

As shown in FIG. 5, FIG. 5 is a top view of a mask plate in some embodiments of the present disclosure. The difference between some embodiments of the present disclosure and an embodiment shown in FIG. 4 is that: the strip-like first blocking wall includes a plurality of short strip-like first sub-blocking walls 201 spaced apart from each other. In other words, two short strip-like first sub-blocking walls 201 are arranged on opposite sides opening 11; the first sub-blocking wall 20 is close to the opening 11 and between two adjacent columns of openings.

In the case that colors of the different columns of the light-emitting layers on the OLED display substrate are different, the short strip-like first sub-blocking wall 201 is between the two adjacent columns of the openings 11. Of course, in some embodiments of the present, in the case that the colors of a same row of the light-emitting layer on the OLED display substrate are different, the short strip-like first sub-blocking wall 201 is between the adjacent rows of two openings.

In some embodiments of the present disclosure, the length of the short strip-like first blocking wall is greater than or equal to a length of the corresponding opening in the direction in which the short strip-like first sub-blocking wall extends, so that one side of the column of openings may be completely blocked. In the case that the light-emitting layer of the OLED display substrate is evaporated, the organic light-emitting material is prevented from diffusing toward one side of the openings.

In some embodiments of the present disclosure, a material of the first blocking wall includes a photoresist, so that a patterning process may be conveniently performed by applying an exposure process. Of course, in some embodiments of the present disclosure, the first blocking wall can also be made of other materials.

A method for manufacturing a mask plate is also provided by some embodiments of the present disclosure for manufacturing any one of the mask plates in the above embodiments. The method includes:

Step 101: providing a mask plate body provided with a plurality of openings arranged in a matrix;

Step 102: forming a first blocking wall on the mask plate body, in which the first blocking wall is close to the plurality of openings, and at least a portion of the first blocking wall is between two adjacent rows or adjacent columns of openings.

Since a material used in the fine metal mask plate (FMM) is less affected by temperature, the patterning process may be performed on an existing fine metal mask plate by the exposure process to form the first blocking wall.

In some embodiments of the present disclosure, the forming a first blocking wall on the mask plate body further includes:

Step 1021: forming a photoresist layer on the mask plate body;

Step 1022: patterning the photoresist layer to form the first blocking wall.

The first blocking wall is made by the photoresist commonly used in the exposure process, which can save materials and has a simple manufacturing process.

Figure 6:
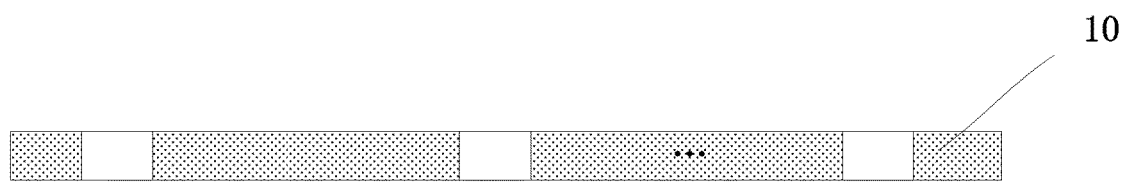
FIGS. 6-8 are schematic views of a method for manufacturing a mask plate in some embodiments of the present disclosure.
Figure 7:
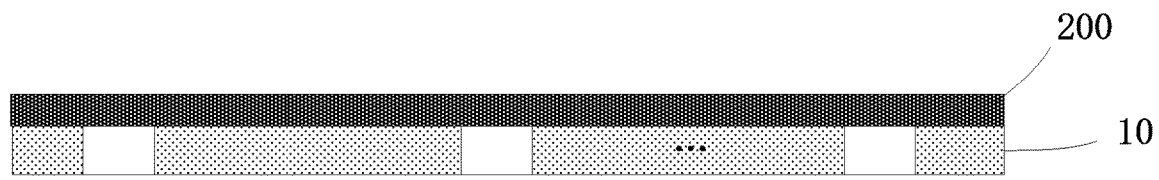

In some embodiments of the present disclosure, the method for manufacturing the mask plate includes:

Step 201: cleaning the mask plate body after a netting of the mask plate body is finished; as shown in FIG. 6, FIG. 6 shows the mask plate body 10 after the netting of the mask plate body is finished;

Step 201: coating the photoresist on the mask plate body 10 uniformly to form a photoresist layer 200, as shown in FIG. 7.

Figure 8:
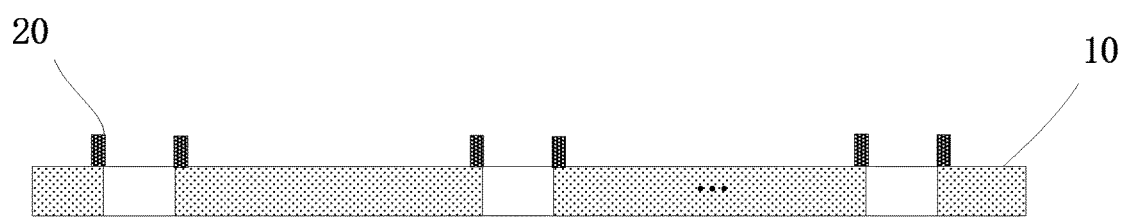

In some embodiments of the present disclosure, the photoresist may be coated on the mask plate body 10 uniformly by using a slit coating method or a spin coating method;

Step 203: exposing the photoresist layer 200 by using the mask plate and developing the resultant photoresist layer 200, to form an annular first blocking wall 20, in which each annular first blocking wall 20 corresponds to and surrounds the corresponding opening on the mask plate body 10, as shown in FIG. 8.

Step 204: baking the first blocking wall 20 which has been formed at a high temperature so as to ensure the support of the first blocking wall 20.

A method for manufacturing an OLED display substrate is further provided in some embodiments of the present disclosure, including:

Step 301: providing a substrate to be evaporated and a mask plate; the mask plate is any one of the mask plate in above embodiments;

Step 302: adjusting a position of the mask plate to abut the first blocking wall on the mask plate against the substrate to be evaporated, in which a position of the opening on the mask plate corresponds to a position of a first color sub-pixel on the substrate to be evaporated, and evaporating and forming a light-emitting layer of the first color sub-pixel;

Step 303: adjusting the position of the mask plate to abut the first blocking wall on the mask plate against the substrate to be evaporated, in which the position of the opening on the mask plate corresponds to a position of a second color sub-pixel on the substrate to be evaporated, and evaporating and forming a light-emitting layer of the second color sub-pixel; and Step 304: adjusting the position of the mask plate to abut the first blocking wall on the mask plate against the substrate to be evaporated, in which the position of the opening on the mask plate corresponds to a position of a third color sub-pixel on the substrate to be evaporated, and evaporating and forming a light-emitting layer of the third color sub-pixel; and in which a first color, a second color, and a third color are enabled mixed to be a white light.

Optionally, the first color, the second color, and the third color are respectively selected from one of red, blue, and green.

Since the organic light-emitting material does not easily flow to other PDL opening regions during evaporation, the OLED display substrate formed by the above method can avoid poor color mixing and have a good display effect.

Figure 9:
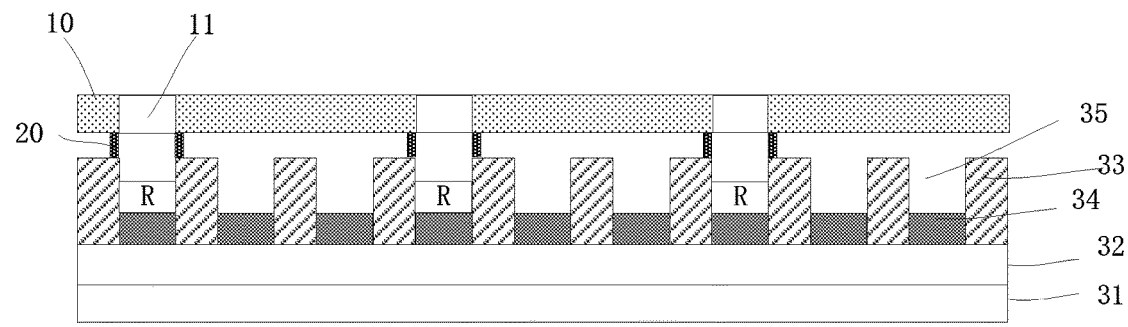
FIGS. 9-11 are schematic views of a method for manufacturing an OLED display substrate in some embodiments of the present disclosure.

As shown in FIG. 9, FIG. 9 is a schematic view of the method for manufacturing an OLED display substrate in some embodiments of the present disclosure. The method in some embodiments of the present disclosure includes:

Step 401: providing a substrate to be evaporated and a mask plate, as shown in FIG. 9;

the substrate to be evaporated includes: a base substrate 31, a thin film transistor array layer 32 on the base substrate 31, a pixel defining layer 33 and an anode 34, in which the pixel defining layer 33 defines a plurality of opening regions 35.

The mask plate includes: a mask plate body 10, the mask plate body 10 is provided with a plurality of openings 11 arranged in a matrix; and a first blocking wall 20 on the mask plate body 10, in which the first blocking wall 20 is annular, and each annular first blocking wall 20 corresponds to and surrounds an opening 11 on the mask plate body 10.

Figure 10:
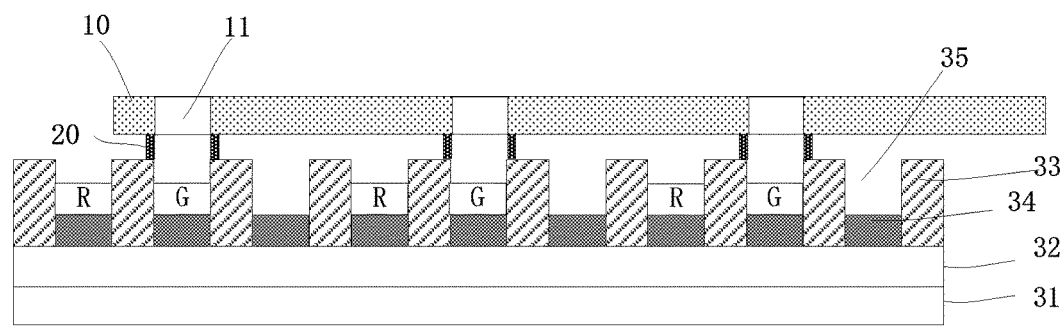
Figure 11:
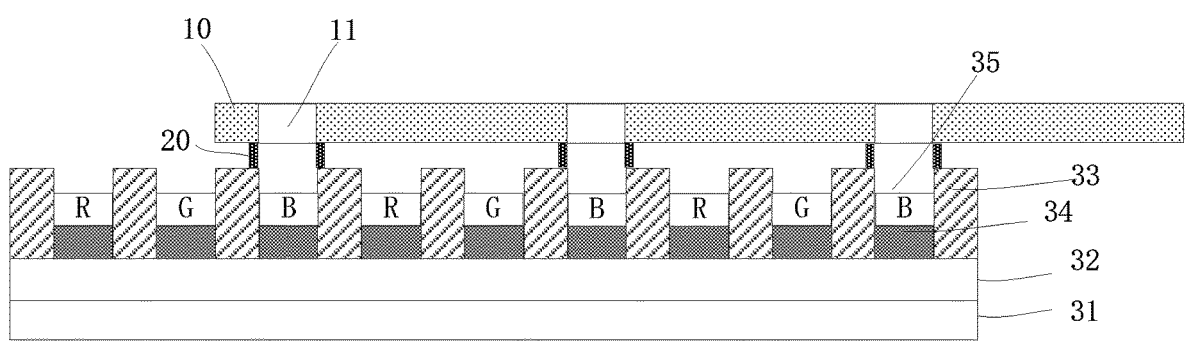

Step 402: as shown in FIG. 9, adjusting a position of the mask plate to abut the first blocking wall 20 on the mask plate against the substrate to be evaporated, in which a position of the opening 11 on the mask plate corresponds to an opening region of a red color sub-pixel on the substrate to be evaporated, and evaporating and forming a light-emitting layer of the red color sub-pixel;

Step 403: as shown in FIG. 10, adjusting the position of the mask plate to abut the first blocking wall 20 on the mask plate against the substrate to be evaporated, in which the position of the opening 11 on the mask plate corresponds to an opening region of a green color sub-pixel on the substrate to be evaporated, and evaporating and forming a light-emitting layer of the green color sub-pixel; and Step 404: as shown in FIG. 11, adjusting the position of the mask plate to abut the first blocking wall 20 on the mask plate against the substrate to be evaporated, in which the position of the opening 11 on the mask plate corresponds to an opening region of a blue color sub-pixel on the substrate to be evaporated, and evaporating and forming a light-emitting layer of the blue color sub-pixel;

An OLED display substrate is further provided in some embodiments of the present disclosure which is formed by the method for manufacturing the OLED display substrate as described above.

In some embodiments of the present disclosure, the first blocking wall is on the mask plate. In the case that the light-emitting layer of the OLED display substrate formed by evaporation is applied, on one hand, the first blocking wall is able to abut against the place between the mask plate and the OLED display substrate to support the mask plate body; on the other hand, the first blocking wall is also able to block the vapor flow of an organic light-emitting material from flowing into other PDL opening regions of the OLED display substrate, thereby avoiding poor color mixing and improving a display effect of the OLED display device.

Furthermore, the OLED display substrate in some embodiments of the present disclosure does not need to be provided with a similar blocking wall, thereby saving a material applied to the OLED display substrate, reducing a thickness of a spacer layer between the light-emitting layers, and improving the flatness of the OLED display substrate. Thus, when a cathode is formed later, a cathode layer is prevented from being broken due to a too thick spacer layer. And in the case that the OLED display substrate is packaged by a thin film packaging layer, the risk of broking of a packaging film due to the too thick spacer layer may be avoided.

An OLED display device is further provided in some embodiments of the present disclosure, including the OLED display substrate made by the method for manufacturing the OLED display substrate.

The OLED display device in some embodiments of the present disclosure further includes the thin film packaging layer for packaging the OLED display substrate. Since the OLED display substrate is not provided with the blocking wall and has a better flatness, an ability of an inorganic packaging layer in the thin film packaging layer may be better and the risk of film broken is reduced. And the thickness of the organic encapsulation layer can also be reduced, thereby saving product materials and reducing production costs.

Of course, in some embodiments of the present disclosure, the blocking wall may not be provided on the mask plate, but provided on the OLED display substrate, which also can support the mask plate body and prevent the vapor flow of the organic light-emitting material from flowing into the other PDL opening regions of the OLED display substrate.

An OLED display substrate is further provided in some embodiments in the present disclosure, including:

a base substrate;

a pixel defining layer on the base substrate, in which the pixel defining layer defines a plurality of opening regions arranged in a matrix;

a second blocking wall on the pixel defining layer, in which the second blocking wall is close to the opening regions, and at least a portion of the second blocking wall is between adjacent rows or adjacent columns of the opening regions.

In some embodiments of the present disclosure, the second blocking wall is in a region surrounding the opening region defined by the pixel defining layer of the OLED display substrate. In the case that the light-emitting layer of the OLED display substrate is evaporated, on one hand, the second blocking wall is able to abut against the place between the mask plate and the OLED display substrate to support the mask plate; on the other hand, the second blocking wall is also able to block the vapor flow of an organic light-emitting material from flowing into other PDL opening regions of the OLED display substrate, thereby avoiding poor color mixing and improving a display effect of the OLED display device.

The structure of the OLED display substrate in some embodiments of the present disclosure will be described below by examples.

Figure 12:
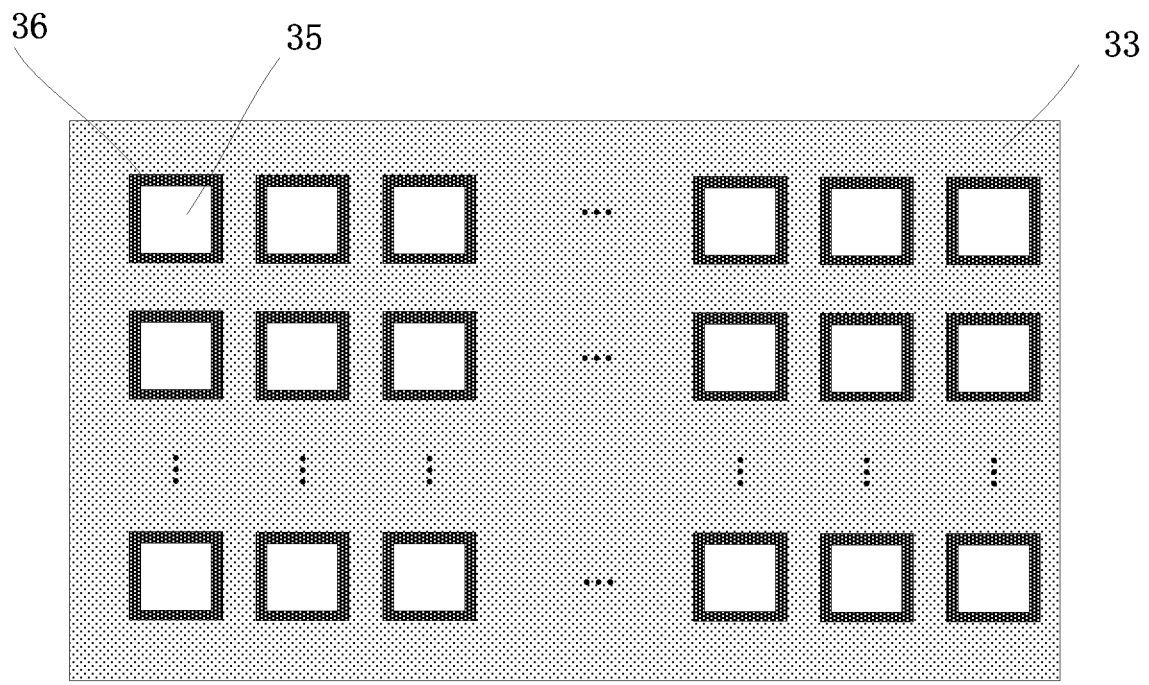
FIG. 12 is a top view of an OLED display substrate in some embodiments of the present disclosure.

As shown in FIG. 12, FIG. 12 is a top view of an OLED display substrate in some embodiments of the present disclosure. The OLED display substrate in some embodiments of the present disclosure includes:

a base substrate (not shown);

a pixel defining layer 33 on the base substrate, in which the pixel defining layer 33 defines a plurality of opening regions 35 arranged in a matrix;

a second blocking wall 36 on the pixel defining layer 33, in which the second blocking wall 36 is annular, each annular second blocking wall 36 corresponds to and surrounds an opening region 35.

In some embodiments of the present disclosure, in the case of the light-emitting layer of the OLED display substrate is formed by evaporation, the annular second blocking wall 36 is able to abut against a place between the mask plate and the OLED display substrate to support the mask; and the annular second blocking wall 36 is also able to prevent the vapor flow of an organic light-emitting material from flowing into other PDL opening regions of the OLED display substrate in all directions, thereby avoiding poor color mixing and improving a display effect of the OLED display device.

In some embodiments of the present disclosure, an orthographic projection of the opening region of the annular second blocking wall 36 onto the base substrate coincides with an orthographic projection of a corresponding opening region 35 on the pixel defining layer. In other words, the edge of the opening region of the annular second blocking wall 36 coincides with the edge of the corresponding opening region 35, so that the vapor flow of the organic light-emitting material may be better limited within the corresponding opening region 35.

Of course, in some embodiments of the present disclosure, the annular second blocking wall may not be arranged to abut against the corresponding opening region, but is arranged to keep a certain distance from the corresponding opening region.

Figure 14:
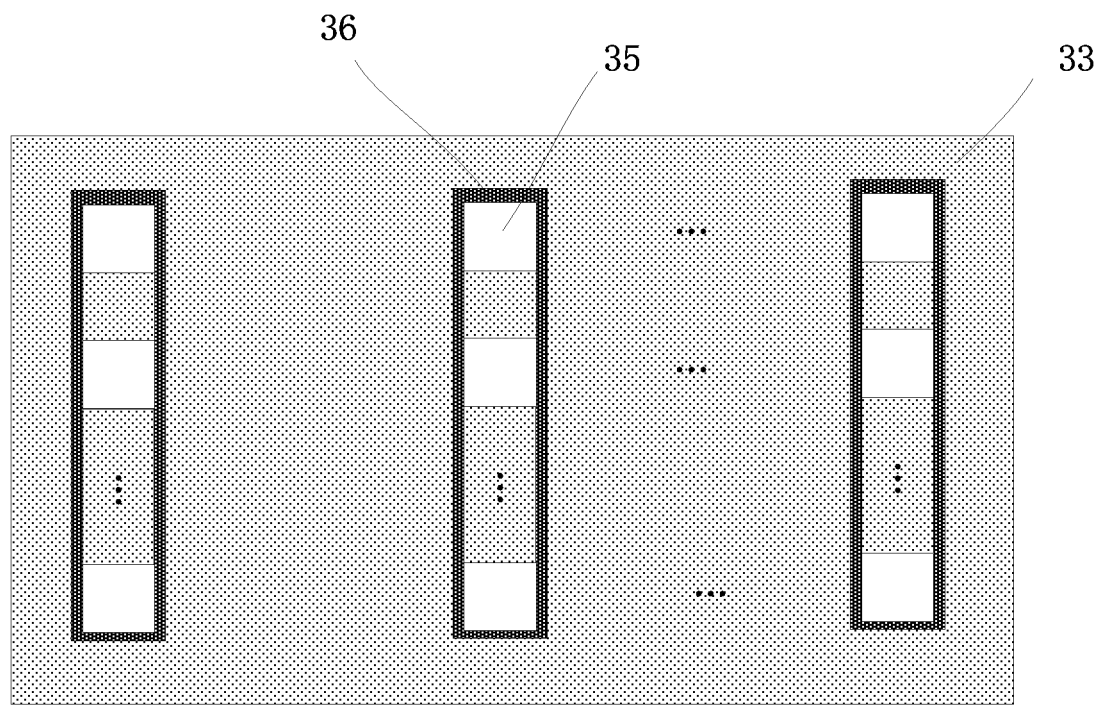
FIG. 14 is a top view of an OLED display substrate in some embodiments of the present disclosure.

In some embodiments of the present disclosure, each annular second blocking wall 36 corresponds to an opening region 35. Of course, in some embodiments of the present disclosure, as shown in FIG. 14, each annular second blocking wall may also correspond to at least two opening regions. In other words, each annular second blocking wall surrounds at least two opening regions. For example, each annular second blocking wall corresponds to a row or a column of opening regions. That is, each annular first blocking wall surrounds the row or the column of opening regions on the mask plate body. As for the annular second blocking walls arranged to a row or a column of opening regions, that depends on the arrangement of the light-emitting layer on the OLED display substrate. If the colors of the different columns of the light-emitting layers on the OLED display substrate are different, the annular second blocking wall 20 corresponds to a column of opening regions; if the colors of the different rows of the light-emitting layers on the OLED display substrate are different, the annular second blocking wall corresponds to a row of opening regions. In some embodiments of the present disclosure, since it is not necessary to make a corresponding annular second blocking wall for each opening region, the difficulty of manufacturing the annular second blocking wall may be reduced.

Figure 13:
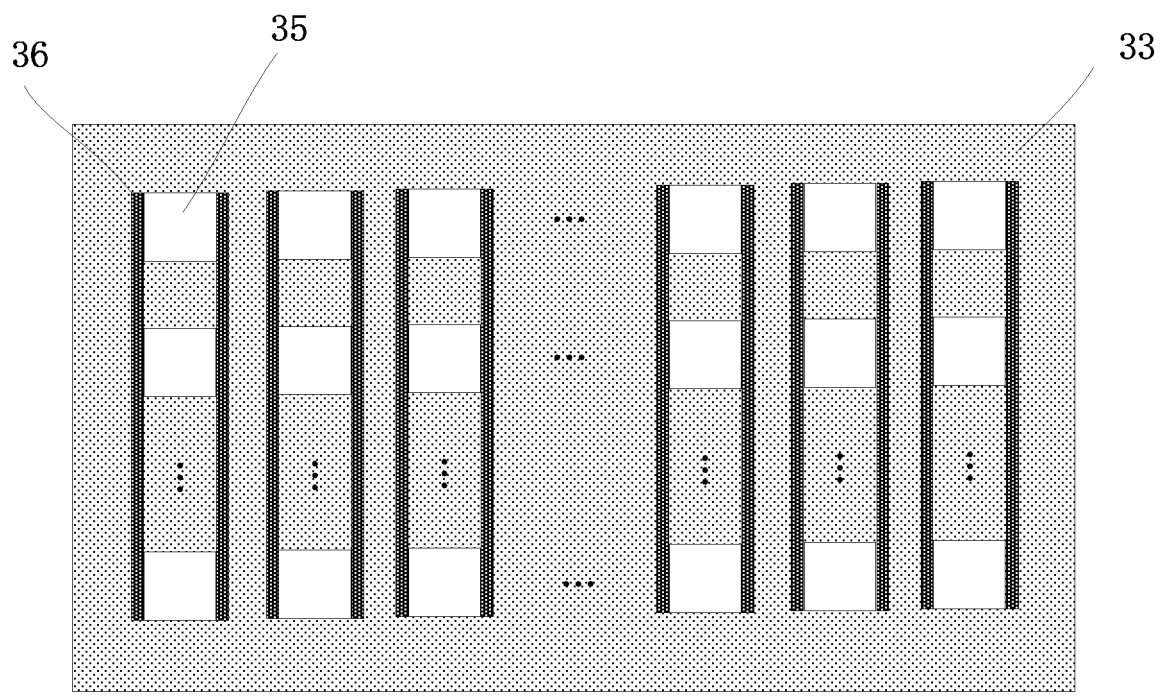
FIG. 13 is a top view of an OLED display substrate in some embodiments of the present disclosure.

As shown in FIG. 13, FIG. 13 is a top view of an OLED display substrate in some embodiments of the present disclosure. The OLED display substrate in some embodiments of the present disclosure includes:

a base substrate (not shown);

a pixel defining layer 33 on the base substrate, in which the pixel defining layer 33 defines a plurality of opening regions 35 arranged in a matrix;

a second blocking wall 36 on the pixel defining layer 33, in which the second blocking wall 36 is strip-like and is between the adjacent two rows of the opening region 35, and two second blocking walls 36 are between the adjacent two columns of the opening regions 35, and each of the second blocking walls 36 is close to the opening region 35 adjacent thereto.

In some embodiments of the present disclosure, in the case that the light-emitting layer of the OLED display substrate formed by evaporation is applied, a strip-like second blocking wall 36 is able to abut against the place between the mask plate and the OLED display substrate to support the mask plate; and the strip-like second blocking wall 36 is also able to block the vapor flow of an organic light-emitting material from flowing into other PDL opening regions of the OLED display substrate, thereby avoiding poor color mixing and improving a display effect of the OLED display device.

In some embodiments of the present disclosure, a length of the strip-like second blocking wall is greater than or equal to a sum length of a column of corresponding opening regions, so that one side of the column of opening regions may be completely blocked. In the case that the light-emitting layer of the OLED display substrate is evaporated, the organic light-emitting material is prevented from diffusing toward one side of the openings.

In the case that colors of the different columns of the light-emitting layers on the OLED display substrate are different, the strip-like second blocking wall 36 corresponds to a column of opening regions and is between two adjacent columns of the opening regions. Of course, in some other embodiments of the present disclosure, in the case that the colors of the light-emitting layers of the OLED display substrate are different, the strip-like second blocking wall corresponds to a row of opening regions, and is between two adjacent rows of the openings. Two second blocking walls are between the two adjacent rows of the openings, and each of the second blocking walls is close to the opening region adjacent thereto.

In some embodiments of the present disclosure, an edge of the strip-like second blocking wall closed to the corresponding opening region coincides with an edge of the corresponding opening to better limit the vapor flow of organic light-emitting material within the corresponding opening region.

Of course, in some embodiments of the present disclosure, the strip-like second blocking wall may not be arranged to abut against the corresponding opening region, but is arranged to keep a certain distance from the corresponding opening region.

Figure 15:
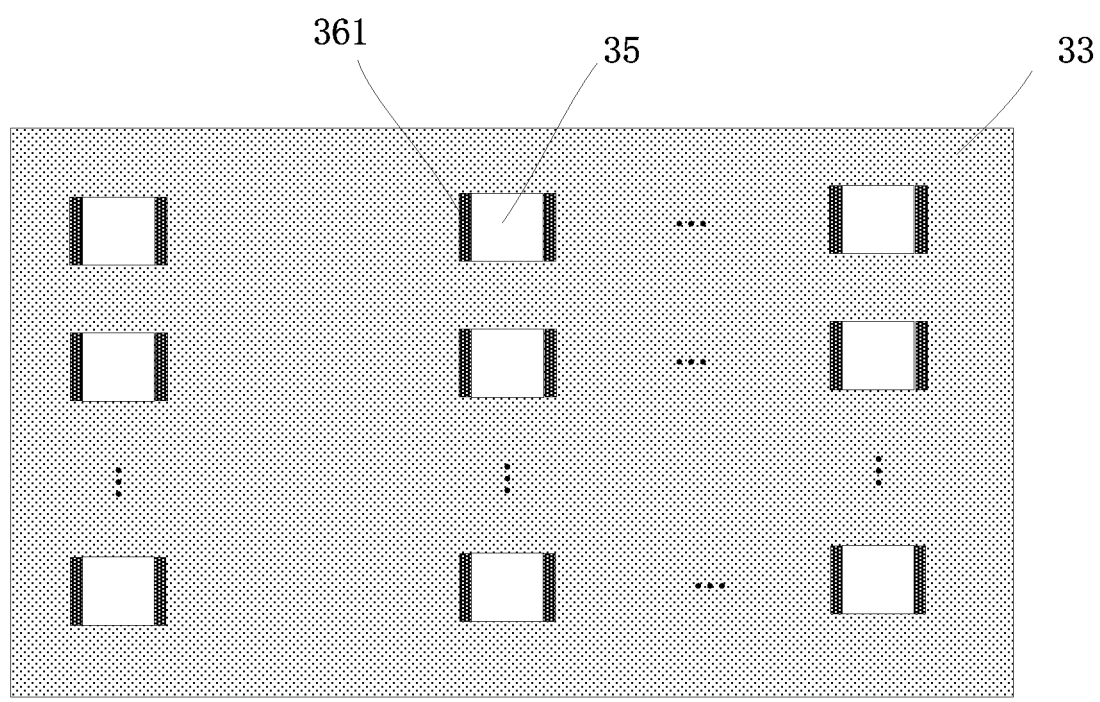
FIG. 15 is a top view of an OLED display substrate in some embodiments of the present disclosure.

As shown in FIG. 15, the strip-like second blocking wall includes a plurality of short strip-like second sub-blocking walls 361 spaced apart from each other. In other words, two short strip-like second sub-blocking wall 361 are arranged on opposite sides opening region 35; the second sub-blocking wall 361 is close to the opening region 35 and between two adjacent columns of opening regions 35.

In the case that colors of the different columns of the light-emitting layers on the OLED display substrate are different, the short strip-like second sub-blocking wall 361 is between the two adjacent columns of the opening regions 35. Of course, in some embodiments of the present, in the case that the colors of a same row of the light-emitting layer on the OLED display substrate are different, the short strip-like second sub-blocking wall 361 is between the adjacent rows of two opening regions 35.

In some embodiments of the present disclosure, two rows of the second sub-blocking walls 361 are between the adjacent two rows of the opening regions 35, and the length of each short strip-like second blocking wall 361 in the row direction is greater than or equal to a length of the corresponding opening region in the row direction; or two columns of the second sub-blocking walls 361 are between the adjacent two columns of the opening regions 35, and the length of each short strip-like second blocking wall 361 in the column direction is greater than or equal to a length of the corresponding opening region in the column direction; so that one side of the column of openings may be completely blocked. In the case that the light-emitting layer of the OLED display substrate is evaporated, the organic light-emitting material is prevented from diffusing toward one side of the opening regions.

In some embodiments of the present disclosure, a material of the second blocking wall includes a photoresist, so that a patterning process may be conveniently performed by applying an exposure process. Of course, in some embodiments of the present disclosure, the second blocking wall can also be made of other materials.

An OLED display device is further provided in some embodiments of the present disclosure including the OLED display substrate in any one of the embodiments hereinabove.

A method for manufacturing an OLED display substrate is further provided in some embodiments of the present disclosure for manufacturing the OLED display substrate including the second blocking wall as described above. The method includes:

Step 501: providing a base substrate;

Step 502: forming a pixel defining layer on the base substrate, in which the pixel defining layer defines a plurality of opening regions arranged in a matrix;

Step 503: forming a blocking wall on the pixel defining layer, the blocking wall is close to the opening region and between at least two adjacent rows or adjacent columns of the opening regions.

Unless defined particularly, technical terms or scientific terms used in the present disclosure are intended to be understood in the ordinary meaning by those skilled in the art. The words "first," "second," and similar terms used in the present disclosure do not indicate any order, quantity or importance, but are merely used to distinguish different components. Similarly, the words "a" or "one" and the like do not indicate a quantity limitation, but mean that there is at least one. "Connect" or "couple" and the like are not limited to physical or mechanical connections, but may include electrical connections, whether direct or indirect. "Upper", "lower", "left", "right", etc. are merely used to indicate the relative positional relationship. When the absolute position of the object to be described is changed, the relative positional relationship is also changed accordingly.

The above are merely some embodiments of the present disclosure. It should be noted that, a person skilled in the art may make further modifications and improvements without departing from the principle of the present disclosure, and these modifications and improvements shall also fall within the scope of the present disclosure.

What is claimed is:

1. A mask plate for manufacturing an organic electroluminescent light-emitting diode OLED display substrate, comprising:
    a mask plate body provided with a plurality of openings arranged in a matrix;
    a first blocking wall arranged on a surface of the mask plate body facing the OLED display substrate, wherein the first blocking wall is proximate to the plurality of openings, and at least a portion of the first blocking wall is between two adjacent rows or adjacent columns of openings,
    wherein an orthographic projection of the first blocking wall onto the mask plate body partially overlaps the mask plate body.

2. The mask plate according to claim 1, wherein the first blocking wall is annular and surrounds at least one opening on the mask plate body.

3. The mask plate according to claim 2, wherein the first blocking wall surrounds one opening on the mask plate body, and the opening coincides with an orthographic projection of a region surrounded by the first blocking wall onto the mask plate body.

4. The mask plate according to claim 2, wherein the first blocking wall surrounds a plurality of openings on the mask plate body, and the openings is within an orthographic projection of a region surrounded by the first blocking wall onto the mask plate body.

5. The mask plate according to claim 1, wherein the first blocking wall is strip-like, and two first blocking walls are arranged between the two adjacent rows or two adjacent columns of the openings; wherein
    a length of the first blocking wall in a row direction is greater than or equal to a sum of lengths of the openings in the row direction in each row; or
    a length of the first blocking wall in a column direction is greater than or equal to a sum of lengths of the openings in the column direction in each column.

6. The mask plate according to claim 1, wherein the first blocking wall comprises a plurality of first sub-blocking walls spaced apart from each other, wherein,
    two rows of the first sub-blocking wall are between two adjacent rows of the openings, and each of the first sub-blocking walls has a length in a row direction greater than or equal to a length of the opening corresponding to the first sub-blocking wall in the row direction; or
    two columns of the first sub-blocking wall are between two adjacent columns of the openings, and each of the first sub-blocking walls has a length in a column direction greater than or equal to a length of the opening corresponding to the first sub-blocking wall in the column direction.

7. The mask plate according to claim 1, wherein a material of the first blocking wall comprises a photoresist.

8. A method for manufacturing a mask plate, applied to manufacture the mask plate according to claim 1, comprising:
    providing a mask plate body provided with a plurality of openings arranged in a matrix;
    forming a first blocking wall on a surface of the mask plate body, wherein the first blocking wall is proximate to the plurality of openings, and at least a portion of the first blocking wall is between two adjacent rows or adjacent columns of openings.

9. The method according to claim 8, wherein the forming the first blocking wall on the mask plate body comprises:
    forming a photoresist layer on the mask plate body;
    patterning the photoresist layer to form the first blocking wall.

10. A method for manufacturing an organic electroluminescent light-emitting diode OLED display substrate, comprising:
    providing a substrate to be evaporated and the mask plate according to claim 1;
    adjusting a position of the mask plate to abut the first blocking wall against the substrate to be evaporated, wherein a position of the opening on the mask plate corresponds to a position of a first color sub-pixel on the substrate to be evaporated, and evaporating and forming a light-emitting layer of the first color sub-pixel;
    adjusting the position of the mask plate to abut the first blocking wall against the substrate to be evaporated, wherein the position of the opening on the mask plate corresponds to a position of a second color sub-pixel on the substrate to be evaporated, and evaporating and forming a light-emitting layer of the second color sub-pixel; and
    adjusting the position of the mask plate to abut the first blocking wall against the substrate to be evaporated, wherein the position of the opening on the mask plate corresponds to a position of a third color sub-pixel on the substrate to be evaporated, and evaporating and forming a light-emitting layer of the third color sub-pixel;
    wherein a first color, a second color and a third color are enabled to be mixed to a white light.

11. An OLED display substrate, formed by the method according to claim 10.

12. An OLED display substrate, comprising:
    a base substrate;
    a pixel defining layer on the base substrate, wherein the pixel defining layer defines a plurality of opening regions arranged in a matrix;
    a second blocking wall on the pixel defining layer, wherein the second blocking wall is in proximate to the opening regions, and at least a portion of the second blocking wall is between adjacent rows or adjacent columns of the opening regions,
    wherein an orthographic projection of the second blocking wall onto the pixel defining layer partially overlaps the pixel defining layer.

13. The OLED display substrate according to claim 12, wherein the second blocking wall is annular and surrounds at least one opening region on the pixel defining layer.

14. The OLED display substrate according to claim 13, wherein the second blocking wall surrounds one opening region on the pixel defining layer, an orthographic projection of the opening region onto the base substrate coincides with an orthographic projection of a region surrounded by the second blocking wall onto the base substrate.

15. The OLED display substrate according to claim 13, wherein the second blocking wall surrounds a plurality of opening regions on the pixel defining layer, orthographic projections of the opening regions onto the base substrate are located within an orthographic projection of a region surrounded by the second blocking wall onto the base substrate.

16. The OLED display substrate according to claim 12, wherein the second blocking wall is strip-like, and two second blocking walls are arranged between the two adjacent rows or two adjacent columns of the opening regions; wherein
    a length of the second blocking wall in a row direction is greater than or equal to a sum of lengths of the opening regions in the row direction in each row; or
    a length of the second blocking wall in a column direction is greater than or equal to a sum of lengths of the opening regions in the column direction in each column.

17. The OLED display substrate according to claim 12, wherein the second blocking wall comprises a plurality of second sub-blocking walls spaced apart from each other, wherein,
    two rows of the second sub-blocking wall are between two adjacent rows of the opening regions, and each of the second sub-blocking walls has a length in a row direction greater than or equal to a length of the opening region corresponding to the second sub-blocking wall in the row direction; or
    two columns of the second sub-blocking wall are between two adjacent columns of the opening regions, and each of the second sub-blocking walls has a length in a column direction greater than or equal to a length of the opening region corresponding to the second sub-blocking wall in the column direction.

18. An OLED display device, comprising the OLED display substrate according to claim 11.

19. A method for manufacturing an OLED display substrate, applied to manufacture the OLED display substrate according to claim 12, comprising:
    providing the base substrate;
    forming the pixel defining layer on the base substrate;
    forming the second blocking wall on the pixel defining layer.

* * * * *